(12) United States Patent
Kim

(10) Patent No.: US 9,466,553 B2
(45) Date of Patent: Oct. 11, 2016

(54) PACKAGE STRUCTURE AND METHOD FOR MANUFACTURING PACKAGE STRUCTURE

(71) Applicant: Samsung Electro-Mechanics Co., Ltd., Suwon-si (KR)

(72) Inventor: Heung Ku Kim, Yeongi-gun (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/044,819

(22) Filed: Oct. 2, 2013

(65) Prior Publication Data
US 2014/0097545 A1    Apr. 10, 2014

(30) Foreign Application Priority Data

Oct. 8, 2012  (KR) .................... 10-2012-0111198

(51) Int. Cl.

| | |
|---|---|
| *H01L 23/48* | (2006.01) |
| *H01L 21/50* | (2006.01) |
| *H01L 23/00* | (2006.01) |
| *H01L 25/03* | (2006.01) |
| *H01L 25/00* | (2006.01) |
| *H01L 23/498* | (2006.01) |
| *H01L 23/538* | (2006.01) |
| *H01L 23/31* | (2006.01) |
| *H01L 25/10* | (2006.01) |

(52) U.S. Cl.
CPC .............. *H01L 23/481* (2013.01); *H01L 21/50* (2013.01); *H01L 23/49816* (2013.01); *H01L 23/49822* (2013.01); *H01L 23/5389* (2013.01); *H01L 24/19* (2013.01); *H01L 24/20* (2013.01); *H01L 25/03* (2013.01); *H01L 25/50* (2013.01); *H01L 23/3114* (2013.01); *H01L 24/13* (2013.01); *H01L 24/16* (2013.01); *H01L 24/81* (2013.01); *H01L 25/105* (2013.01); *H01L 2224/0401* (2013.01); *H01L 2224/04105* (2013.01); *H01L 2224/05567* (2013.01); *H01L 2224/12105* (2013.01); *H01L 2224/131* (2013.01); *H01L 2224/13022* (2013.01); *H01L 2224/16146* (2013.01); *H01L 2224/73259* (2013.01); *H01L 2225/1035* (2013.01); *H01L 2225/1058* (2013.01); *H01L 2924/00014* (2013.01); *H01L 2924/15311* (2013.01); *H01L 2924/15331* (2013.01); *H01L 2924/181* (2013.01); *H01L 2924/18162* (2013.01)

(58) Field of Classification Search
CPC ........................... H01L 23/3114; H01L 24/16
USPC ........................................................ 438/613
See application file for complete search history.

(56) References Cited

U.S. PATENT DOCUMENTS

| 6,642,136 B1 * | 11/2003 | Lee et al. ...................... 438/613 |
| 6,777,777 B1 * | 8/2004 | Kar-Roy ............. H01L 23/5223 257/310 |

(Continued)

FOREIGN PATENT DOCUMENTS

| WO | WO 2010/010911 A1 | 1/2010 |
| WO | WO 2010/055869 A1 | 5/2010 |

*Primary Examiner* — Nicholas Tobergte
(74) *Attorney, Agent, or Firm* — NSIP Law

(57) ABSTRACT

Disclosed herein is a method for manufacturing a package structure. According to an exemplary embodiment of the present invention, the method for manufacturing a package structure includes: preparing a die having a metal pillar disposed on one surface thereof; bonding the die on the metal plate to allow the metal pillar to face the outside; forming an insulating film covering the metal plate and the die; buffing the insulating film so as to expose the metal pillar; and manufacturing a first package structure by forming a circuit structure electrically connected to the metal pillar on the insulating film.

4 Claims, 4 Drawing Sheets

100a

(56) References Cited

U.S. PATENT DOCUMENTS

| | | | |
|---|---|---|---|
| 8,487,435 B2* | 7/2013 | Juskey | H01L 21/561 257/690 |
| 8,502,372 B2* | 8/2013 | Osenbach | H01L 23/36 257/704 |
| 2007/0298603 A1* | 12/2007 | Rebibis et al. | 438/613 |
| 2011/0175213 A1* | 7/2011 | Mori | H01L 23/13 257/675 |
| 2011/0291263 A1* | 12/2011 | West | H01L 23/293 257/737 |

* cited by examiner

PACKAGE STRUCTURE AND METHOD FOR MANUFACTURING PACKAGE STRUCTURE

This application claims the benefit under 35 U.S.C. Section 119 of Korean Patent Application Serial No. 10-2012-0111198 entitled "Package Structure And Method For Manufacturing Package Structure" filed on Oct. 8, 2012, which is hereby incorporated by reference in its entirety into this application.

BACKGROUND OF THE INVENTION

1. Technical Field

The present invention relates to a package structure and a method for manufacturing the same, and more particularly, to a package structure with improved manufacturing efficiency and a method for manufacturing the same.

2. Description of the Related Art

With the development of a high-density and high-performance semiconductor package, various package technologies have been developed. As the semiconductor package technologies, there is a package technology which bonds a die to a circuit board using a non-conductive paste (NCP). In more detail, the semiconductor package is manufactured by bonding a die to a circuit board while connecting a copper pillar and a metal bump to be aligned with each other, after the die having a copper (Cu) pillar disposed on one surface thereof and the circuit board having a metal bump disposed on one surface thereof are prepared and a non-conductive paste is interposed between the die and the circuit board.

However, in the case of the package technology using the non-conductive paste, a phenomenon that the non-conductive paste is not completely filled between the circuit board and the bump at the time of the packaging occurs. In this case, voids occur within the non-conductive paste, which is a cause of the occurrence of short between circuit patterns of the semiconductor package. Further, when a pitch between the metal pillars of the die is fine, it is difficult to match the metal pillars with the metal bumps, which causes the packaging defect.

RELATED ART DOCUMENT

Patent Document (Patent Document 1) Korean Patent Laid-Open Publication No. 10-2011-0070924

SUMMARY OF THE INVENTION

An object of the present invention is to provide a package structure with improved manufacturing efficiency and a method for manufacturing the same.

Another object of the present invention is to provide a package structure capable of solving problems occurring at the time of using a non-conductive paste and a method for manufacturing the same.

According to an exemplary embodiment of the present invention, there is provided a package structure, including: a metal plate; a die bonded to the metal plate to allow a metal pillar so as to face the outside; an insulating film covering the metal plate and the die so as to expose the metal pillar; and a metal pattern electrically connected to the metal pillar on the insulating film.

The circuit structure may be formed by performing a plating process on the insulating film.

The insulating film may be formed by directly laminating the insulating film on the metal plate and the die.

According to another exemplary embodiment of the present invention, there is provided a method for manufacturing a package structure, including: preparing a die having a metal pillar disposed on one surface thereof; bonding the die on the metal plate to allow the metal pillar to face the outside; forming an insulating film covering the metal plate and the die; buffing the insulating film so as to expose the metal pillar; and manufacturing a first package structure by forming a circuit structure electrically connected to the metal pillar on the insulating film.

The forming of the circuit structure includes: forming a metal seed layer covering the insulating film; forming an anti-plating pattern on the metal seed layer; forming a plating film on the metal seed layer by using the anti-plating pattern as an anti-plating film; and removing the anti-plating pattern.

The method for manufacturing a package structure may further include: forming a metal pattern by removing a part of the metal plate so as to expose the die; preparing a second package structure in which an external connection terminal is formed; and laminating the second package structure on the first package structure, while bonding the external connection terminal to the metal pattern.

The preparing of the die may include preparing a semiconductor integrated circuit chip having an inner via, and the method for manufacturing a package structure may further include: removing the metal plate so as to expose the die; and laminating an additional die on the exposed die.

The forming of the insulating film may include directly laminating the insulating film on the metal plate and the die.

DESCRIPTION OF THE PREFERRED EMBODIMENTS

Figure 1:
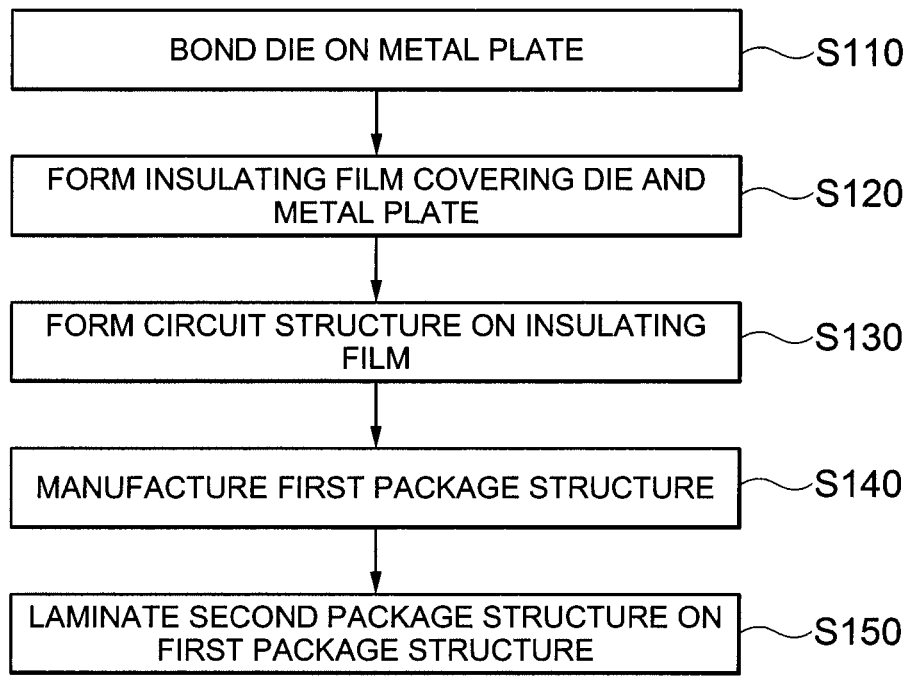
FIG. 1 is a flow chart showing a method for manufacturing a package structure according to an exemplary embodiment of the present invention.

Various advantages and features of the present invention and methods accomplishing thereof will become apparent from the following description of embodiments with reference to the accompanying drawings. However, the present invention may be modified in many different forms and it should not be limited to exemplary embodiments set forth herein. Rather, these embodiments may be provided so that this disclosure will be thorough and complete, and will fully convey the scope of the invention to those skilled in the art. Like reference numerals throughout the specification denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Further, the exemplary embodiments described in the specification will be described with reference to cross-sectional views and/or plan views that are ideal exemplification figures. In drawings, the thickness of layers and regions is exaggerated for efficient description of technical contents. Therefore, exemplified forms may be changed by manufacturing technologies and/or tolerance. Therefore, the exemplary embodiments of the present invention are not limited to specific forms but may include the change in forms generated according to the manufacturing processes For example, an etching region vertically shown may be rounded or may have a predetermined curvature.

Hereinafter, a package structure and a method for manufacturing the same according to exemplary embodiments of the present invention will be described in detail with reference to the accompanying drawings.

FIG. 1 is a flow chart showing a method for manufacturing a package structure according to an exemplary embodiment of the present invention and FIGS. 2 to 5 are views describing a process of manufacturing a package structure according to the exemplary embodiment of the present invention.

Figure 2:
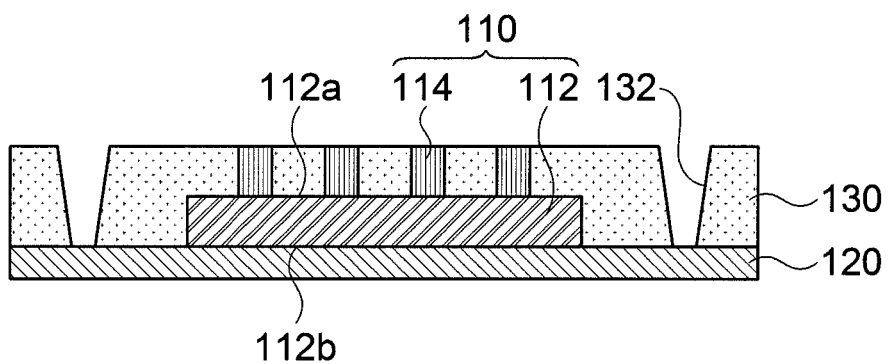
FIGS. 2 to 5 are views describing a process of manufacturing a package structure according to the exemplary embodiment of the present invention.

Referring to FIGS. 1 and 2, a die 110 may be bonded on a metal plate 120 (S110). In detail, the die 110 may be prepared. In the preparing of the die 110, a semiconductor integrated circuit chip 112 having one surface 112a on which a metal pillar 114 is formed and the other surface 112b which is an opposite surface to the one surface may be prepared. The metal pillar 114 may be made of a copper material. Meanwhile, the metal plate 120 may be prepared. As the metal plate 120, a thin plate made of the copper material having relatively high thermal conductivity may be used. Further, the other surface 112b of the die 110 may be bonded on the metal plate 120 to allow the metal pillar 114 to face the outside.

An insulating film 130 which covers the die 110 and the metal plate 120 may be formed (S120). The forming of the insulating film 130 may include laminating the insulating film covering the die 110 and the metal plate 120, along with the metal pillar 114 and polishing or buffing the insulating film 130 so as to expose the metal pillar 114 and a part of the metal plate 120. Herein, the directly laminating of the insulating film 130 may be defined as directly covering the insulating film 130 on the die 110 and the metal plate 120, without using intermediate materials, such as a non-conductive paste (NCP). Therefore, the die 110 and the metal plate 120 are covered on the metal plate 120, but the insulating film 130 having a via hole 132 through which the metal pillar 114 is exposed and at the same time, a part of the metal plate 120 is exposed may be formed.

Figure 3:
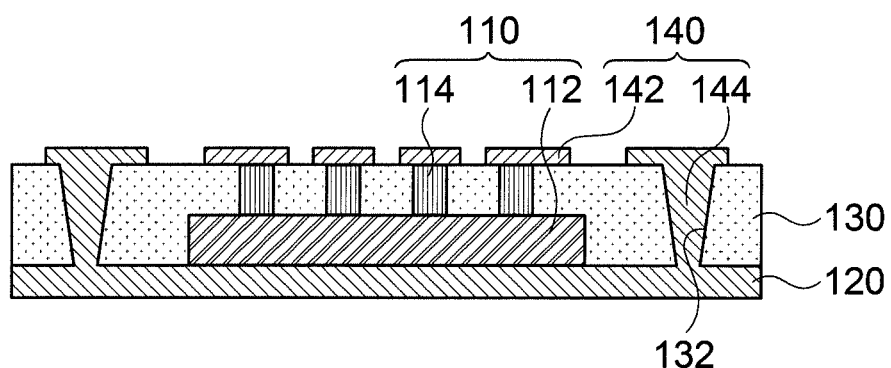

Referring to FIGS. 1 and 3, a circuit structure 140 may be formed on the insulating film 130 (S130). The forming of the circuit structure 140 may include forming a metal seed layer (not illustrated) on the insulating film 130, forming an anti-plating pattern (not illustrated) on the metal seed layer, forming a plating film by performing a plating process using the anti-plating pattern as an anti-plating film, and removing the anti-plating pattern. Therefore, a metal via 142 formed in the via hole 132 of the insulating film 130 may be formed on the insulating film 130 and a circuit pattern 144 electrically connected to the metal pillar 114 may be formed on the insulating film 130.

Figure 4:
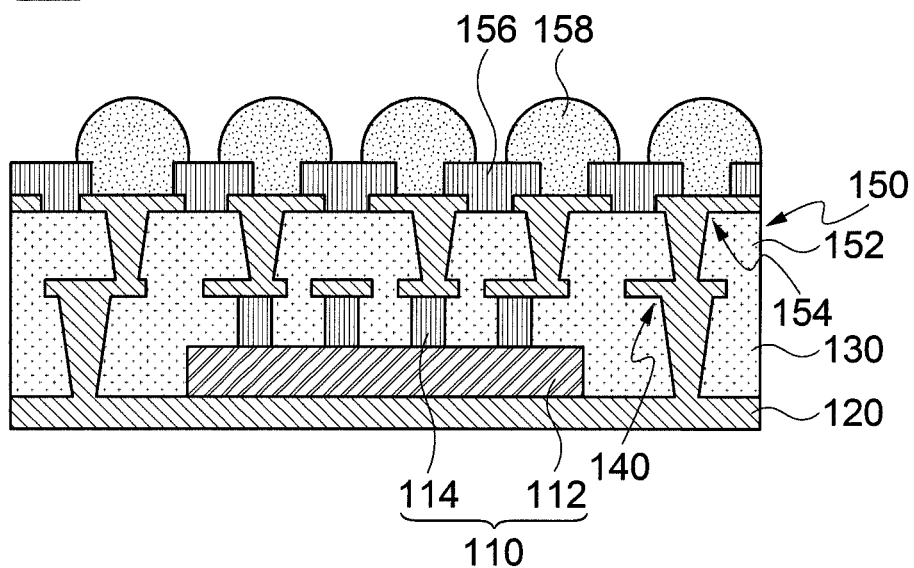

Referring to FIGS. 1 and 4, a first package structure 101 may be manufactured (S140). The manufacturing of the first package structure 101 may be performed by further forming a circuit substrate layer 150 on results previously illustrated in FIG. 3. The forming of the circuit substrate layer 150 may include forming an outside layer 152 made of an insulating material on the results described above with reference to FIG. 3, forming a wiring structure 154 configured of a conductive via, a circuit pattern, and the like, on the outside layer 152, forming a solder resist pattern 156 exposing the wiring structure 154 on the outside layer 152, and bonding an external connection terminal 158 to the wiring structure 154 exposed by the solder resist pattern 156. As the external connection terminal 158, a solder ball may be used. By the above described process, the first package structure 101 in which the die 110 having the metal pillar 114 is packaged may be manufactured, without using the non-conductive paste (NCP).

Figure 5:
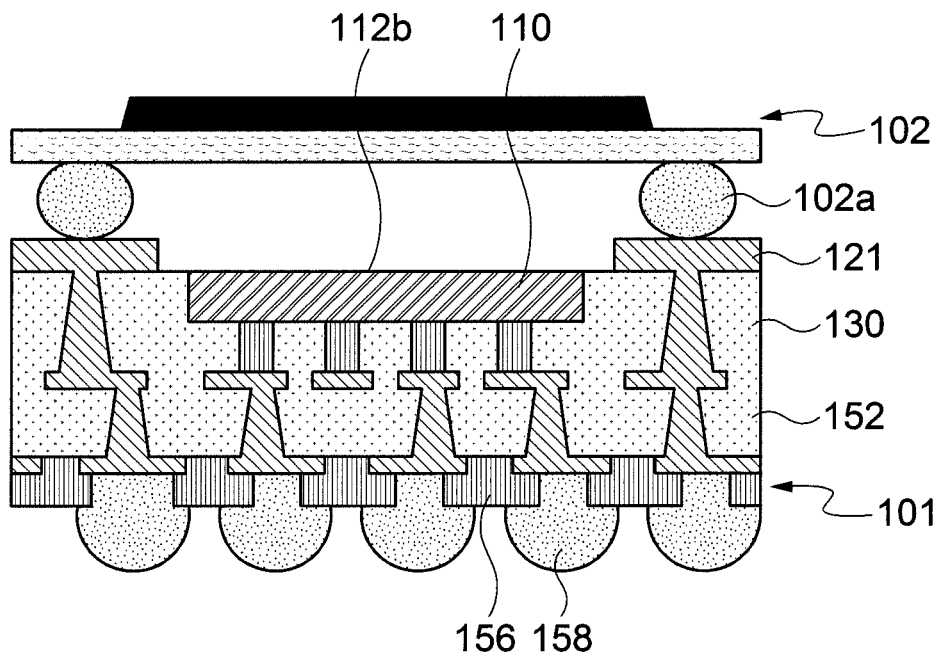

Referring to FIGS. 1 and 5, a second package structure 102 may be laminated on the first package structure 101 (S150). For example, the second package structure 102 may be prepared. The second package structure 102 may include a circuit board on which the connection terminal 102a is formed. A metal pattern 121 for electrical connection of the second package structure 102 may be formed by removing a part of the metal plate 120 of FIG. 4 so as to expose the other surface 112b of the die 110 of the first package structure 101. Further, the connection terminal 102a of the second package structure 102 may be bonded to the metal pattern 121 of the first package structure 101. Therefore, the package structure 100 in a package on package (POP) type may be manufactured.

As described above, a method for manufacturing a package structure according to the exemplary embodiment of the present invention may manufacture a package substrate by disposing the die 110 having the metal pillar 114 on the metal plate 120. In this case, compared to a technology of packaging the die having the metal pillar by using the non-conductive paste, the occurrence problem of voids occurring at the time of using the non-conductive paste may be solved and a heat radiating effect of the die 110 may be improved. Therefore, according to the package structure and the method for manufacturing the same according to the exemplary embodiments of the present invention, the packaging may be implemented by bonding the die having the metal pillar on the metal plate without using the non-conductive paste, thereby preventing the voids from occurring within the insulating film at the time of using the non-conductive paste and improving the heat radiating effect of the die.

The method for manufacturing a package structure according to the exemplary embodiment of the present invention may form the circuit structure 140 on the insulating layer 130 after the die 110 having the metal pillar 114 is disposed on the metal plate 120 and the insulating film 130 covering the metal pillar 114 and the die 110 is directly laminated. In this case, compared to the case of bonding the die to the substrate by interposing the non-conductive paste therebetween, the matching degree of the die 110 and the circuit structure 140 may increase, which may be very advantageous in the packaging of the die having the metal pillar of a pine pitch. Therefore, according to the package structure and the method for manufacturing the same according to the exemplary embodiments of the present invention, the matching degree of the metal pillar and the circuit structure may be improved by forming the circuit structure electrically connected to the metal pillar after directly laminating the insulating film on the die having the metal pillar without using the non-conductive paste.

According to the method for manufacturing a package structure according to the exemplary embodiment of the present invention, the second package structure 102 may be laminated on the first package structure 101 in the state in which the other surface of the die 110 is exposed to the outside, without using a separate protective film, such as an epoxy molding compound (EMC). In this case, the package structure 100 may be manufactured without using the separate protective film, in the state in which the die 110 disposed in the first package structure 101 is exposed to the outside. Further, according to the method for manufacturing a package structure according to the exemplary embodiments of the present invention, the package structure in the package on package (POP) type may be manufactured without covering the die with the separate protective film, such as the epoxy molding compound, thereby more reducing the overall thickness of the package structure and more improving the heat radiating effect of the die as compared with the case of using the protective film. Further, according to the package structure and the method for manufacturing a package structure according to the exemplary embodiments of the present invention, the metal pillar of the die may be partially etched, thereby implementing the thinner package on package.

Hereinafter, a method for manufacturing a package structure according to a modified example of the present invention will be described in detail. Herein, a description of overlapping portions with the method for manufacturing a package structure according to the exemplary embodiment of the present invention described above will be omitted or simplified.

Figure 6:
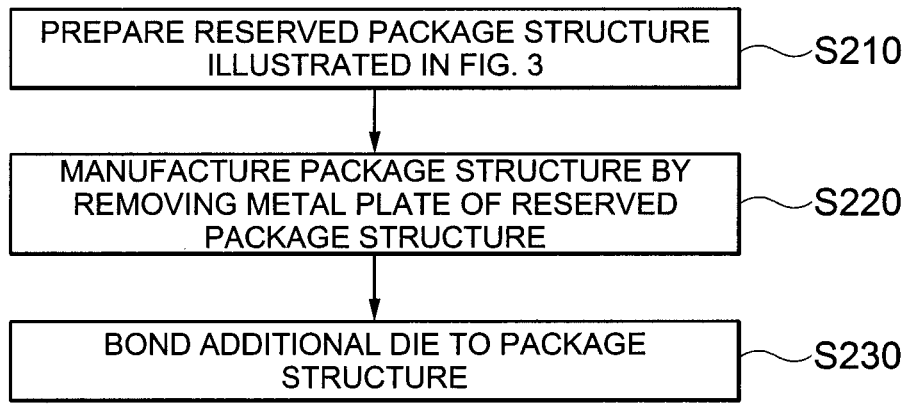
FIG. 6 is a flow chart illustrating a package structure according to a modified example of the present invention.
Figure 7:
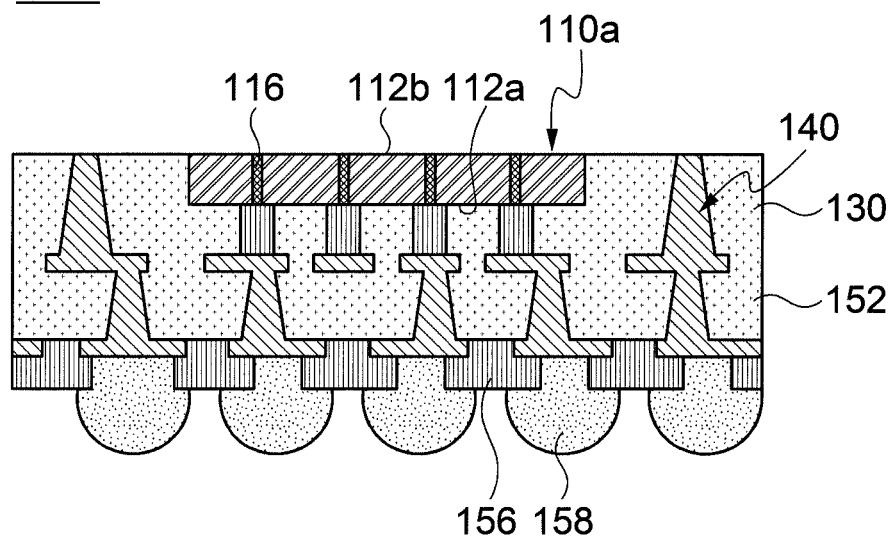
FIGS. 7 and 8 are views describing a process of manufacturing a package structure according to a modified example of the present invention.
Figure 8:
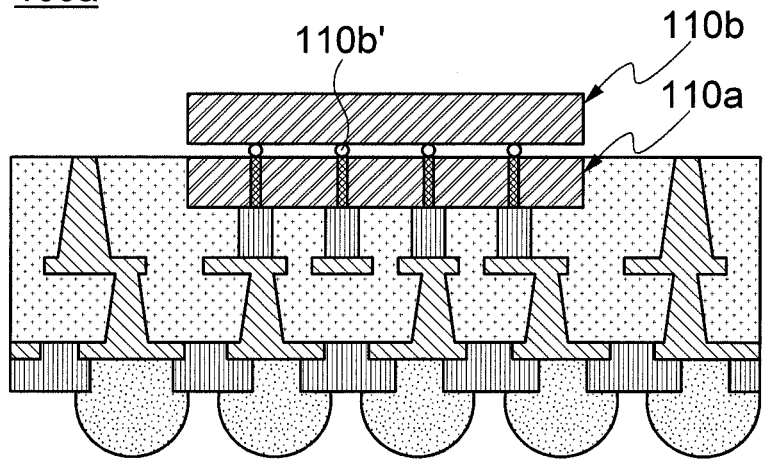

FIG. 6 is a flow chart illustrating a package structure according to a modified example of the present invention and FIGS. 7 to 8 are views describing a process of manufacturing a package structure according to a modified example of the present invention.

Referring to FIGS. 6 and 7, a reserved package structure illustrated in FIG. 3 may be prepared (S210). The preparing of the reserved package structure may be similar to one described above with reference to FIGS. 2 and 3. However, the die 110a to be packaged may have an inner via 116 electrically connected to the metal pillar 114 on the one surface 112a thereof, while penetrating through the one surface 112a and the other surface 112b of the die 110a. The die 110a having the above-mentioned structure may be the semiconductor integrated circuit chip having a through silicon via (TSA) structure. The inner via 116 may be manufactured during the process of manufacturing the die 110a. As another example, the inner via 116 may be directly formed on the die 110a after the metal plate 120 is removed as described above.

Further, the package structure 101a may be manufactured by removing the metal plate of the reserved package structure (S220). The removing of the metal plate may be performed by performing a predetermined etching process on the metal plate 120 so as to expose the other surface 112b of the die 110a and the metal via 144 of the circuit structure 140. Therefore, the package structure 101a in which the inner via 116 of the die 110a is exposed to the outside may be manufactured.

Referring to FIGS. 6 and 8, the additional die 110b may be bonded to the package structure 101a (S230). The bonding of the additional die 110b may include performing an electrical inspection on the die 110a, preparing a semiconductor integrated circuit chip having a connection terminal 110b' disposed on one surface thereof, and bonding the additional die 110b to the die 110a so that the connection terminal 110b' is electrically connected to the inner via 116 of the die 110a. When the defect of the die 110a occurs during the performing of the electrical inspection on the die 110a, a new die may be replaced or a performance of a subsequent process may be retained. Therefore, the package structure 101a having a structure in which the two dies 110a and 110b are laminated may be manufactured.

By the above-mentioned process, the package structure 100a having a structure in which the plurality of dies 110a and 110b are laminated may be manufactured. The package structure 100a may solve a part of the known good die (KGD) which is a disadvantage of the through silicon via, by mounting the additional die after manufacturing the package using the through silicon via (STA) die and completing the electrical inspection thereon. Further, according to the method for manufacturing a package structure according to the exemplary embodiments of the present invention, the semiconductor package using the die having the through silicon via (TSV) structure can be implemented without using the non-conductive paste to solve the problem of the known good die (KGD) which is a disadvantage of the through silicon via package, thereby improving the manufacturing yield and the reducing the manufacturing costs.

According to the package structure and the method for manufacturing the same according to the exemplary embodiments of the present invention, the packaging can be implemented by bonding the die having the metal pillar on the metal plate without using the non-conductive paste, thereby preventing the voids from occurring within the insulating film at the time of using the non-conductive paste and improving the heat radiating effect of the die.

Further, according to the package structure and the method for manufacturing the same according to the exemplary embodiments of the present invention, the matching degree of the metal pillar and the circuit structure can be improved by forming the circuit structure electrically connected to the metal pillar after directly laminating the insulating film on the die having the metal pillar without using the non-conductive paste.

Further, according to the package structure and the method for manufacturing the same according to the exemplary embodiments of the present invention, the package structure in the package on package (POP) type can be manufactured without covering the die with the separate protective film, such as the epoxy molding compound, thereby more reducing the overall thickness of the package structure and more improving the heat radiating effect of the die as compared to the case of using the protective film. Further, according to the method for manufacturing a package structure according to the exemplary embodiments of the present invention, the metal pillar of the die can be partially etched, thereby implementing the thinner package on package.

Further, according to the package structure and the method for manufacturing the same according to the exemplary embodiments of the present invention, the semiconductor package using the die having the through silicon via (TSV) structure can be implemented without using the non-conductive paste to solve the problem of the known good die (KGD) which is a disadvantage of the through silicon via package, thereby improving the manufacturing yield and the reducing the manufacturing costs.

The present invention has been described in connection with what is presently considered to be practical exemplary embodiments. In addition, the above-mentioned description discloses only the exemplary embodiments of the present invention. Therefore, it is to be appreciated that modifications and alterations may be made by those skilled in the art without departing from the scope of the present invention disclosed in the present specification and an equivalent thereof. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A package structure, comprising:
  a die comprising a through silicon via (TSV) disposed inside the die, wherein the through silicon via (TSV) extends from a first surface of the die to a second surface of the die;
  an insulating film comprising a first portion covering the die, and a second portion including a via hole;
  a metal pillar disposed on the first surface of the die and extending from a first surface of the insulating film to a second surface of the insulating film, wherein the metal pillar is electrically connected to the through silicon via (TSV);
  a circuit structure comprising a metal via disposed in the via hole; and
  a circuit pattern disposed on the second surface of the insulating film, wherein the circuit pattern is electrically connected to the metal pillar.

2. The package structure according to claim 1, wherein the circuit structure is formed by performing a plating process on the insulating film.

3. The package structure according to claim 1, wherein the insulating film is formed by directly laminating the insulating film on the die.

4. A package structure, comprising:
  a die comprising
    a first surface of the die,
    a second surface of the die, and
    a through silicon via (TSV) disposed inside the die, and extending from the first surface of the die to the second surface of the die;
  a metal pillar disposed on the first surface of the die, and disposed inside the through silicon via (TSV), and extending from the first surface of the die to the second surface of the die;
  an insulating film covering a portion of the first surface of the die, and wherein a portion of the insulating film is disposed to isolate the die from the via hole;
  a circuit structure comprising a metal via disposed in the via hole; and
  a circuit pattern disposed on the second surface of the die, wherein the circuit pattern is electrically connected to the metal pillar.

* * * * *